United States Patent [19]

Halawani et al.

[11] Patent Number: 5,315,620
[45] Date of Patent: May 24, 1994

[54] ARRANGEMENT FOR CORRECTION OF SYNCHRONOUS DEMODULATOR QUADRATURE PHASE ERRORS

[75] Inventors: Natalie Halawani, Brooklyn; Theodore Koutsoudis, Farmingdale; John M. Kowalski, Greenlawn, all of N.Y.

[73] Assignee: Grumman Aerospace Corporation, Bethpage, N.Y.

[21] Appl. No.: 877,427

[22] Filed: May 1, 1992

[51] Int. Cl.$^5$ .............................................. H04B 1/10
[52] U.S. Cl. ................................... 375/102; 329/304; 375/94
[58] Field of Search ................ 375/39, 78, 94, 99, 375/102; 329/304, 307, 308

[56] References Cited

U.S. PATENT DOCUMENTS

| | | | |
|---|---|---|---|
| 4,689,804 | 8/1987 | Srinivasagopalan | 375/99 |
| 4,757,319 | 7/1988 | Lankl | 375/102 |
| 4,947,409 | 8/1990 | Raith et al. | 375/99 |
| 5,153,527 | 10/1992 | Yaguchi | 329/307 |

OTHER PUBLICATIONS

W. F. Gabriel, "Adaptive Digital Processing Investigation of DFT Subbanding vs Transversal Filter Canceler," Naval Research Laboratory, NRL Report 8981, Jul. 28, 1986.

L. M. Goodman, "Hardware Limitations on Digital Adaptive Nulling," Massachusetts Institute of Technology, Lincoln Laboratory, Project Report RST-39, Revision 1, Nov. 3, 1988.

D. R. Miedaner et al., "Digital Quadrature Processing," Adaptive Technology, Inc., Mar. 29, 1989.

*Primary Examiner*—Stephen Chin
*Attorney, Agent, or Firm*—Scully, Scott, Murphy & Presser

[57] ABSTRACT

An arrangement for detecting quadrature phase errors introduced by a synchronous demodulator between the two quadrature channels, in-phase (I) and quadrature-phase (Q), of a synchronous demodulator, and for correcting for such detected quadrature phase errors without the need for high data sampling rates. During an initial test period, a periodic symmetrical test signal of known frequency is introduced into the synchronous demodulator. During the test period, the output of the synchronous demodulator is integrated over an integer multiple of periods to detect the quadrature phase error introduced by the synchronous demodulator, and an error signal is generated representative of the detected quadrature phase error. During a following period of operation of the synchronous demodulator, the in-phase (I) and quadrature-phase (Q) signals produced by the synchronous demodulator are applied to a quadrature phase error correction network, along with the generated quadrature phase error signal. The quadrature phase error correction network applies the quadrature phase error signal to at least one of the in-phase and quadrature-phase signals to minimize or eliminate the detected quadrature phase error between the in-phase and quadrature-phase signals.

7 Claims, 9 Drawing Sheets

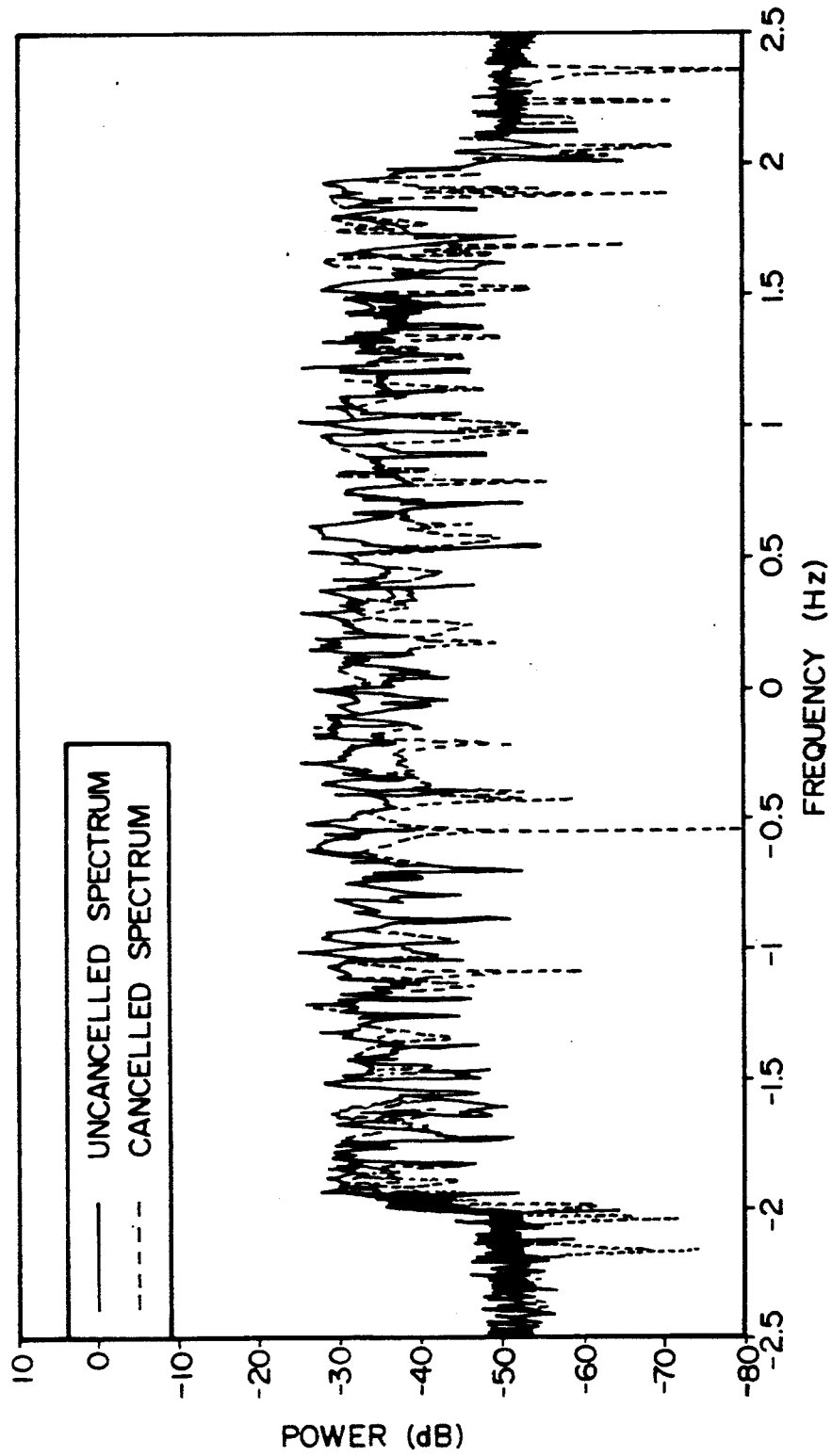

ARRANGEMENT FOR CORRECTION OF SYNCHRONOUS DEMODULATOR QUADRATURE PHASE ERRORS

BACKGROUND OF THE INVENTION

1. Field of the Invention

The present invention relates generally to an arrangement for the correction of quadrature phase errors normally introduced by a synchronous demodulator. More particularly, the subject invention pertains to a system and method for determining quadrature phase errors between the two quadrature channels of a synchronous demodulator and provides a digital technique for correcting detected phase errors, without the need for high data sampling rates.

2. Discussion of the Prior Art

In almost all prior art digital systems which use a synchronous demodulator, quadrature phase errors are introduced by the synchronous demodulator which generates In-Phase (I) and quadrature phase (Q) channel signals. In radar systems, a quadrature phase error is highly undesirable because of doppler processing and adaptive null forming.

In digital systems utilizing a synchronous demodulator, such as pulsed doppler and adaptive processing radar systems, it is desirable that any quadrature phase errors introduced by the synchronous demodulator be corrected. In a doppler radar system, quadrature phase errors can create doppler frequency target sidelobes. In an adaptive processing radar system, quadrature phase errors limit the amount of clutter and jamming interference cancellation which can be achieved. The present invention provides a technique for correcting these quadrature phase errors normally introduced by a synchronous demodulator without the need for high data sampling rates.

In a doppler radar system, a quadrature phase error typically creates a frequency echo that appears as a false target at some doppler frequency other than that of the target. This frequency is a function of the magnitude of the quadrature phase error and the original doppler frequency of the received signal. FIGS. 6, 7 and 8 illustrate this effect for a target having a doppler frequency of 369 Hz for a system having 0.5-deg., 5-deg. and 50-deg. quadrature phase errors, respectively. As can be seen from these Figures, a peak appears at the target frequency (369 Hz) and a high false target also appears at 282 Hz. This false target increases as the magnitude of the quadrature phase error increases. Thus, unless the quadrature phase error is eliminated or maintained at a sufficiently low level, false target reports commonly known as ghosts are generated.

In an adaptive processing radar system, quadrature phase errors can severely degrade system channel match, which limits the amount of clutter and jamming cancellation that can be achieved. Any channel equalization techniques that may be used, such as transversal filters or multi-taps incorporated into the adaptive processing architecture, can only correct the quadrature errors to a very limited degree. FIG. 9 illustrates the small improvement (i.e. 2-3 dB) that can be achieved with a 32 tap transversal filter for two channels mismatched with a 5-deg. quadrature phase error.

Digital sampling techniques, such as those proposed in A DIRECT QUADRATURE SAMPLING APPROACH, D. R. Miedaner et al., Adaptive Technology, Inc., Mar. 29, 1989, and Charles Radar of MIT Lincoln Lab, can be used to create in-phase and quadrature channels that are completely free of synchronous demodulator quadrature phase errors. The publication by Miedaner et al. presents a description of a digital sampling technique that derives quadrature signals directly without using synchronous demodulators. However, these techniques require A/D converters with very high sampling rates. For instance, if a 4 MHz IF bandwidth is used to obtain a 125 ft. range resolution, an A/D converter with a sampling rate of at least 16 MHz is required to eliminate aliasing. In addition, the dynamic range requirements of the radar system calls for an A/D converter with 12-14 bits. With present state of the art technology, 12-14 bits at 16 MHz results in a rather large electronic package, which makes it inappropriate for many applications.

The present invention provides an alternate approach that uses readily available A/D converters (e.g. 12 bits, sampled between 5 and 10 MHz), and consists of a digital correction technique which is able to measure and correct for quadrature phase errors to within 0.01 degrees.

SUMMARY OF THE INVENTION

Accordingly, it is a primary objective of the present invention to provide an arrangement for the correction of quadrature phase errors normally introduced by a synchronous demodulator.

A further objective of the subject invention is the provision of a system and method for determining quadrature phase errors between the two quadrature channels of a synchronous demodulator, and also of a digital technique for correcting detected phase errors, to within 0.01 degrees, without the need for high data sampling rates.

In accordance with the teachings herein, the present invention provides a technique for correcting I and Q orthogonality errors normally introduced by a synchronous demodulator. This technique can be applied to any digital system utilizing a synchronous demodulator, and specifically can be applied to radar systems as a part of an overall alignment procedure. It can correct quadrature phase error to within 0.01-deg., and can accomplish this in a very short time interval (typically 60 to 80 $\mu$sec). These results can be achieved when a test signal having a sufficient S/N level is used (i.e. >30 dB).

In accordance with a preferred embodiment, the present invention provides a method for detecting quadrature phase errors introduced by a synchronous demodulator between the two quadrature channels (I and Q) of a synchronous demodulator, and for correcting for such detected quadrature phase errors without the need for high data sampling rates. Pursuant to the method, during an initial and periodically occurring test period, a periodic symmetrical test signal of known frequency is introduced into the synchronous demodulator. During each such test period, the output of the synchronous demodulator is integrated over an integer multiple of periods to detect the quadrature phase error introduced by the synchronous demodulator, and an error signal is generated representative of the detected quadrature phase error.

During each following period of operation of the synchronous demodulator, the in-phase (I) and quadrature-phase (Q) signals produced by the synchronous demodulator are applied to a quadrature phase error correction network, along with the generated quadrature phase error signal. The quadrature phase error correction network applies the quadrature phase error signal to at least one of the in-phase and quadrature-phase signals to minimize or eliminate the detected quadrature phase error between the in-phase and quadrature-phase signals.

In greater detail, the step of integrating comprises applying the in-phase and quadrature-phase signals produced by the synchronous demodulator to an integrate-and-dump filter. The integrate-and-dump filter is preferably programmed to dump after a period of time $T = N2\pi/\omega_c$ sec, wherein N is an integer, and $\omega_c$ is the frequency of the test signal of known frequency.

The output signals of the synchronous demodulator inphase (I) and quadrature-phase (Q) channels during each periodically reoccurring test period are given by:

$$I = A \cos(\omega_c t) + n_I(t)$$

$$Q = A \cos(\omega_c t - \Theta) + n_Q(t)$$

wherein A is the amplitude of the signal and $n_I(t)$ and $n_\omega(t)$ are respectively the noise components in each of the I and Q channels, and $\omega_c$ is the frequency of the test signal of known frequency.

The output $E\{J\}$ of the integrate-and-dump filter is $$E\{J\} = \frac{A^2 \sin \epsilon}{2} + b$$

wherein $\epsilon$ is the quadrature-phase error, b is a bias term representing the system noise contribution measured in the absence of an input signal, and $A^2$ is the average power. Pursuant to the last equation, a summer circuit is coupled to the output of the integrate-and-dump filter for subtracting therefrom b the system noise contribution. A filter circuit is coupled to the output of the summer circuit for filtering therefrom the term $A^2/2$ wherein $A^2$ is the average power, such that the filter output isolates the sine of the detected synchronous demodulator error, $\epsilon_{OUT}$. Accordingly, the output of the filter circuit is directed to an arc sine derivation circuit for taking the arc sine of the sine $\epsilon_{OUT}$, and the output of the arc sine derivation means $\epsilon_{OUT}$, is directed as an input to the quadrature-phase error correction network.

When the Q quadrature channel is being corrected, and $X(nT_s)$ is the uncorrected Q channel output, and $X'_Q(nT_S)$ and $X'_I(nT_S)$ represent respectively the corrected Q and I channel outputs, then $X'_Q(nT_S)$ is derived by $$X_Q'(nT_s) = \frac{X_Q(nT_s) - X_I(nT_s) \sin \epsilon_{OUT}}{\cos \epsilon_{OUT}}$$

wherein
n—sample number
$T_S$—sampling interval
$\omega_C$—$2\pi f_C$
$F_c$—carrier frequency of the test signal of known frequency.

When the I quadrature channel is being corrected, then $X'_I(nT_S)$ is derived by $$X_I'(nT_s) = \frac{X_I(nT_s) + X_Q'(nT_s) \sin \epsilon_{OUT}}{\cos \epsilon_{OUT}}$$

BRIEF DESCRIPTION OF THE DRAWINGS

The foregoing objects and advantages of the present invention for an arrangement for the correction of synchronous demodulator quadrature errors may be more readily understood by one skilled in the art with reference being had to the following detailed description of a preferred embodiment thereof, taken in conjunction with the accompanying drawings wherein like elements are designated by identical reference numerals throughout the several views, and in which:

FIG. 9 illustrates, in an adaptive processing radar system utilizing a channel equalization technique with multitaps incorporated into the adaptive processing architecture, the small improvement (i.e. 2-3 dB) in quadrature errors which can be achieved with a 32 tap transversal filter for two channels mismatched with a 5-deg. quadrature phase error.

DETAILED DESCRIPTION OF THE DRAWINGS

Figure 1:
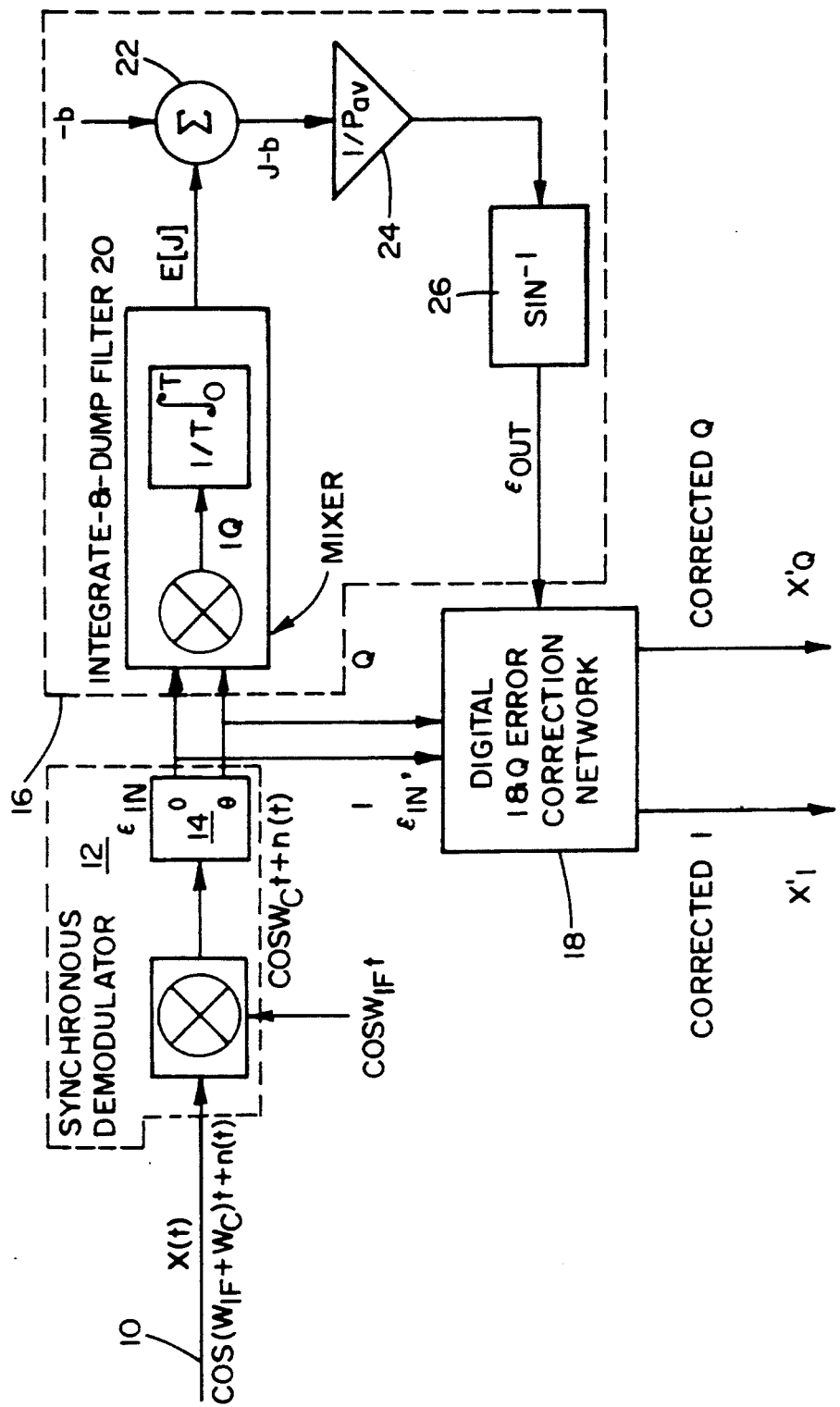
FIG. 1 is a block diagram of an exemplary embodiment of a system for the measurement and correction of synchronous demodulator quadrature phase errors constructed pursuant to the teachings of the present invention.

Referring to the drawings in detail, FIG. 1 illustrates a digital technique for measuring and correcting quadrature phase errors normally introduced by a synchronous demodulator. A first portion of this digital technique detects the quadrature error caused by imperfections in the synchronous demodulator circuitry by using a reference periodic symmetric signal of known frequency which is integrated over an integer multiple of periods.

A signal is received over an input 10 from a synchronous modulator which has been downconverted to an intermediate frequency $\omega_{IF}$, and is received as one input to a synchronous demodulator 12. The signal received on input 10 consists of a sinusoid input x(t), plus a stationary random Additive Gaussian Noise (AGN), n(t), band limited to $\pm B/2$ radians/sec, where B is the bandwidth of the signal. The synchronous demodulator 12 also receives a reference intermediate frequency signal $\cos \omega_{IF} t$, and mixes the signals on two levels. The synchronous demodulator down-converts the signal received on input 10 to an intermediate frequency, $\omega_{IF}$, to produce a signal $\cos \omega_c t + n(t)$ which is directed to a hybrid 14 which is a part of the synchronous demodulator which phase shifts the signal by $\theta$ degrees and 0 degrees. Ideally $\theta = \pi/2$, but in reality this is often not the case, in which case the synchronous demodulator introduces quadrature phase errors into the signals. The arrangement of FIG. 1 is designed to detect and correct for such phase errors; i.e. offsets in $\theta$ from $\pi/2$, In FIG. 1, the true synchronous demodulator error between the quadrature channels is designated $\epsilon_{IN}$. The outputs of the synchronous demodulator 12 I and Q channels are given by:

$$I = A \cos(\omega_c t) + n_I(t) \tag{1}$$

$$Q = A\cos(\omega_c t - \omega) + n_Q(t) \tag{2}$$

where A is the amplitude of the signal and $n_I(t)$ and $n_Q(t)$ are the noise components in each channel.

The remainder of the circuit of FIG. 1 in dashed block 16 is provided to measure for quadrature phase errors $\epsilon_{IN}$ in the quadrature signals I and Q, while the Digital I and Q Error Correction Network 18 is provided to correct for all such measured quadrature phase errors.

The arrangement of FIG. 16 operates in two different modes, a first periodic measurement mode in which the circuit in block 16 periodically measures the introduced phase error $\epsilon_{IN}$, and a second periodic operating mode in which the correction network 18 corrects the quadrature phase errors in the signals I and Q produced by the synchronous demodulator 10, 12.

In the first periodic measurement mode, a reference signal is introduced at input 10 to the synchronous demodulator 10, 12, and the output signals I and Q of the synchronous demodulator are introduced to circuit 16 having an integrate-and-dump filter 20. The output of the integrate-and-dump filter 20 (which is programmed to dump after a period $T = N2\pi/\omega_C$ sec, wherein N is an integer) can be written as:

$$E\{J\} = \frac{A^2}{T} \int_0^T I \cdot Q \, dt = \tag{3}$$

$$\frac{A^2}{T} \int_0^T \{\cos \omega_C t + n_I(t)\} \{\cos(\omega_C t - \theta) + n_Q(t)\} dt$$

where $\omega_C$ is the frequency of the test signal and $A^2$ is the average power represented by $P_{AV}$ in FIG. 1. Note, cos $(\omega_C t - \frac{1}{4})$ can be rewritten as sin $(\omega_C t + \frac{1}{4})$ where $\epsilon = \pi/2 - \frac{1}{4}$.

Solving equation 3 for $E\{J\}$, the output of the filter 20 yields:

$$E\{J\} = \frac{A^2 \sin \epsilon}{2} + \frac{1}{T} \int_0^T E\{n_I(t) n_Q(t)\} dt = \tag{4}$$

$$\frac{A^2 \sin \epsilon}{2} + \frac{1}{T} \int_0^T R\{n_I(t) n_Q(t)\} dt = \frac{A^2 \sin \epsilon}{2} + b$$

The bias term b represents the system noise contribution and is periodically measured in the absence of any desired signal. The measured system noise b, which can be measured during an initial calibration procedure, is then subtracted by a summing circuit 22 to eliminate b from $E\{J\}$ in equation (4). The term $A^2/2$ in equation is next filtered or divided out by filter circuit 24 to eliminate that term, leaving only sin $\epsilon$. The circuit 26 takes the arc sin of sin $\epsilon$ to derive $\epsilon$ from sin $\epsilon$, thereby producing $\epsilon_{OUT}$ which is used by correction network 18 to correct for the measured quadrature phase error. Details of the derivation of equation (4) are given herinbelow for a signal of amplitude A

DERIVATION OF TECHNIQUE USED TO DETERMINE THE QUADRATURE ERROR GENERATED BY THE SYNCHRONOUS DEMODULATOR $$J = \frac{1}{T} \int_0^T \{A \cos wt + n_I(t)\} \{A \sin(wt + \epsilon) + n_Q(t)\} dt$$

$$= \frac{1}{T} \int_0^T \{A^2 \cos wt(\sin(wt + \epsilon)) + An_I(t)\sin(wt + \epsilon) + An_Q(t)\cos wt + n_I(t)n_Q(t)\} dt$$

$$= \frac{1}{T} \int_0^T A^2 \cos wt(\cos wt \sin \epsilon + \sin wt \cos \epsilon) dt +$$

$$\frac{A}{T} \int_0^T n_I(t)\sin(wt + \epsilon) dt + \frac{A}{T} \int_0^T n_Q(t)\cos wt \, dt +$$

$$\frac{1}{T} \int_0^T n_I(t) n_Q(t) dt$$

$$= \frac{A^2}{T} \int_0^T \cos^2 wt \sin \epsilon \, dt +$$

$$\frac{A^2}{T} \int_0^T \cos wt \sin wt \cos \epsilon \, dt +$$

$$\frac{A}{T} \int_0^T n_I(t)\{\cos wt \sin \epsilon + \cos \epsilon \sin wt\} dt +$$

$$\frac{A}{T} \int_0^T n_Q(t)\cos wt \, dt + \frac{1}{T} \int_0^T n_I(t)n_Q(t) dt$$

$$= \frac{A^2}{T} \int_0^T 0.5(1 + \cos 2wt)\sin \epsilon \, dt + 0 + 0 + 0 +$$

$$\frac{1}{T} \int_0^T n_I(t)n_Q(t) dt$$

$$= \frac{A^2}{T} \int_0^T 0.5 \sin \epsilon \, dt +$$

$$\frac{1}{T} \int_0^T n_I(t)n_Q(t) dt; \text{ where } E\{n_I(t)n_Q(t)\} = b$$

$$J = \frac{A^2}{2} \sin \epsilon + b$$

$$\sin \epsilon = \frac{2(J - b)}{A^2}$$

Therefore, $\epsilon = \sin^{-1}\left[\frac{2(J - b)}{A^2}\right]$

In summary, summer 22 first substractively combines the signal $E\{J\}$ with the noise cross-correlation $(-b)$, the output of which is passed through a filter 24 output to isolate the sin of the synchronous demodulator error $\epsilon$, which then allows 26 to take the arc sin thereof to produce the error $\epsilon$. The error $\epsilon$ ideally represents the actual error $\epsilon_{IN}$ that exists between the channels. In practice, the calculated error denoted by $\epsilon_{OUT}$ only approximates the true error $\epsilon_{IN}$ between the channels, which appears at the synchronous demodulator 12 output. Exact equality cannot be achieved because of thermal noise in the channels and numerical roundoffs caused by finite integration times. However, the calculated error $\epsilon_{OUT}$ is used in the digital I and Q error correction network 18 to correct the actual I and Q channel data. The derivation of the correction technique is described below.

The signal representation for the in-phase channel (I) with the noise term removed is given by:

$$X_I(t) = A \cos(\omega_C t + \epsilon_{INI}) \qquad (5)$$

The signal representation of the Q channel with the noise term removed is:

$$X_Q(t) = A \sin(\omega_C t + \epsilon_{INQ}) \qquad (6)$$

where $\epsilon_{INI,Q}$ represents the quadrature error which could be introduced on either the I or the Q channel, respectively. Note: If the synchronous demodulator were ideal, both $\epsilon_{INI}$ and $\epsilon_{INQ}$ would be zero ($\epsilon_{INI,Q}=0$).

If a quadrature error exists in the Q channel, the corrected output for this channel will be a pure sinusoid that is 90 degrees out of phase with the I channel. In general, an expression for $\sin \omega t$ in terms of $\sin(\omega t + \epsilon)$ and $\cos \epsilon t$ can be obtained by using the following trigonometric identity:

$$\sin(\omega t + \epsilon) = (\sin \omega t)(\cos \epsilon) + (\cos \omega t)(\sin \epsilon) \qquad (7)$$

where $\sin(\omega t + \epsilon)$ represents the input signal with quadrature phase error, $\sin(\omega t)$ represents a corrected input signal without quadrature phase error, $\cos(\omega t)$ represents a corrected I channel input without quadrature phase error, and $\sin \epsilon$ and $\cos \epsilon$ represent the sine and cosine of the phase error $\epsilon$.

Thus the expression for $\sin \epsilon t$, an input signal without quadrature phase error becomes:

$$\sin \omega t = \frac{\sin(\omega t + \epsilon) - \cos \omega t \sin \epsilon}{\cos \epsilon} \qquad (8)$$

Equation 8 represents an analog solution, and is used to obtain the required data correction. The expression $\sin(\omega t + \epsilon)$ becomes $\sin(\omega + \epsilon_{IN})$ which represents the actual Q channel output (A being a known quantity); $\sin \epsilon$ becomes $\sin \epsilon_{OUT}$ and $\cos \epsilon$ becomes $\cos \epsilon_{OUT}$ since these are the unknowns that are computed using equation 4. Letting $X'_I$ and $X'_Q$ denote the corrected I and Q components, respectively, equations 5 and 8 become equations 9 and 10 as follows:

$$X'_I(nT_S) = X_I(nT_S) = \cos(\omega_C nT_S) \qquad (9)$$

where $X_I(nT_S)$ is the actual I channel output and is used as reference; and $$X'_Q(nT_S) = [A \sin(\omega_C nT_S + \epsilon_{IN}) - A \cos(\omega_C nT_S) \sin \epsilon_{OUT}] / [(\cos \epsilon_{OUT})] \qquad (10)$$

Equation (10) represents a digital solution wherein the first term represents equation (6), the second term represents equation (5) without error, $\omega_C$ is a constant, and $\epsilon_{OUT}$ is the output of 26.

or $$X_{Q'}(nT_s) = \frac{X_Q(nT_s) - X_I(nT_s) \sin \epsilon_{OUT}}{\cos \epsilon_{OUT}} \qquad (11)$$

where
n = sample number
$T_S$ = sampling interval
$\omega_C = 2\pi f_C$.

$F_C$ = carrier frequency of the test signal.
$\epsilon_{IN}$ actual quadrature error.
$\epsilon_{OUT}$ = computed quadrature error.

In equation (11), $X'_Q(nT_S)$ is a corrected Q output, $X_Q(nT_S)$ is an uncorrected Q output, and $X'_I(nT_S)$ is a corrected output. Accordingly, in equation (11) the I output is assumed to be correct, and the Q output is phase shifted to correct for detected quadrature phase errors.

The sign of $\epsilon_{OUT}$ indicates the channel which is in error. When the sign of $\epsilon_{OUT}$ is positive, the Q channel is in error; and when the sign is negative, the I channel is in error. So far, the derivations have described the mathematics for when the Q channel is in error. When the I channel is in error, the same basic derivation process is performed. The expression $\cos(\omega t + \epsilon)$ is expanded and solved for $\cos \epsilon t$. Once all the necessary substitutions are performed, the correction equation for the I channel becomes:

$$X_{I'}(nT_s) = \frac{X_I(nT_s) + X_{Q'}(nT_s) \sin \epsilon_{OUT}}{\cos \epsilon_{OUT}} \qquad (12)$$

The corrected data in equations (11) and (12), $X'_I(nT_S)$ and $X'_Q(nT_S)$, are thus expressed in terms of measured data, $X_I$ and $X_Q$, as well as the estimate of the quadrature error, $\epsilon_{OUT}$. After implementation, the corrected I (or Q) channel is multiplied by the reference channel and integrated (or correspondingly when the Q channel is in error) to compute the effectiveness of this correction technique. The result of this multiplication and integration is given by $\epsilon_{COR}$. If $\epsilon_{COR}$ is close to zero, the quadrature demodulator error, $\epsilon_{IN}$, has been removed and the objective has been accomplished. Detailed results of this correction technique as a function of signal-to-noise (SN) and integration time, $T_C$ ($T_C = N/f_C$ where N is the number of periods integrated), for when the Q channel is in error are presented in Table 1 through 4.

As an example, in Table 1 an input signal of 0.5 MHz with 40 dB S/N level was injected into a synchronous demodulator having a 5degree quadrature error. After integrating for 16 μsec (eight complete cycles), a 4.97-degree quadrature error was computed. Subsequently, after correction the new computed error was 0.01 degrees.

TABLE 1

Achievable Quadrature Error Corrections as a Function of Sampling Rate (Signal-to-Noise = 40 dB, No. of Periods = 8)

| $f_C$(MHz) | $\frac{1}{T_S}$ (MHz) | $\epsilon°_{IN}$ | $\epsilon°_{OUT}$ | $\epsilon°_{COR}$ | $T_C$(μsec) |
|---|---|---|---|---|---|
| 0.1 | 2.5 | 5 | 4.97 | −0.12 | 80 |
| 0.1 | 5.0 | 5 | 5.01 | 0.01 | 80 |
| 0.1 | 6.0 | 5 | 5.02 | −0.03 | 80 |
| 0.5 | 2.5 | 5 | 5.10 | 0.17 | 16 |
| 0.5 | 5.0 | 5 | 4.97 | 0.01 | 16 |
| 0.5 | 6.0 | 5 | 4.93 | 0.08 | 16 |
| 1.0 | 2.5 | 5 | 4.59 | 0.22 | 8 |
| 1.0 | 5.0 | 5 | 4.81 | −0.14 | 8 |
| 1.0 | 6.0 | 5 | 5.32 | −0.51 | 8 |

TABLE 2

Achievable Quadrature Error Corrections as a Function of Sampling Rate (Signal-to-Noise = 40 dB, No. of Periods = 4)

| $f_C$(MHz) | $\frac{1}{T_S}$ (MHz) | $\epsilon°_{IN}$ | $\epsilon°_{OUT}$ | $\epsilon°_{COR}$ | $T_C$(μsec) |
|---|---|---|---|---|---|
| 0.1 | 2.5 | 5 | 4.77 | 0.17 | 40 |
| 0.1 | 5.0 | 5 | 5.12 | 0.18 | 40 |

TABLE 2-continued

Achievable Quadrature Error Corrections as a Function of
Sampling Rate (Signal-to-Noise = 40 dB, No. of Periods = 4)

| $f_C$(MHz) | $\frac{1}{T_S}$ (MHz) | $\epsilon^*_{IN}$ | $\epsilon^*_{OUT}$ | $\epsilon^*_{COR}$ | $T_C$(μsec) |
|---|---|---|---|---|---|
| 0.1 | 6.0 | 5 | 4.74 | 0.33 | 40 |
| 0.5 | 2.5 | 5 | 4.40 | 0.72 | 8 |
| 0.5 | 5.0 | 5 | 5.07 | −0.20 | 8 |
| 0.5 | 6.0 | 5 | 5.19 | −0.10 | 8 |
| 1.0 | 2.5 | 5 | 4.80 | −0.03 | 4 |
| 1.0 | 5.0 | 5 | 5.21 | −0.50 | 4 |
| 1.0 | 6.0 | 5 | 5.54 | −0.72 | 4 |

This result indicates excellent performance both in computing and correcting for the quadrature error. Similar results have been obtained for different combinations of input signal frequency and data sampling rates as shown in Table 1 and 2. The time required to achieve these results is based upon integration of four and eight complete waveform periods. This translates to a total computation time ranging from 4 to 80 μsec. The best results were obtained with an 80μsec computation time.

TABLE 3

Achievable Quadrature Error Corrections as a Function of
Sampling Rate (Signal-to-Noise = 20 dB, No. of Periods = 8)

| $f_C$(MHz) | $\frac{1}{T_S}$ (MHz) | $\epsilon^*_{IN}$ | $\epsilon^*_{OUT}$ | $\epsilon^*_{COR}$ | $T_C$(μsec) |
|---|---|---|---|---|---|
| 0.1 | 2.5 | 5 | 4.94 | 0.48 | 80 |
| 0.1 | 5.0 | 5 | 4.84 | 0.34 | 80 |
| 0.1 | 6.0 | 5 | 5.30 | −1.64 | 80 |
| 0.5 | 2.5 | 5 | 7.24 | −5.09 | 16 |
| 0.5 | 5.0 | 5 | 5.68 | −0.96 | 16 |
| 0.5 | 6.0 | 5 | 5.33 | −2.16 | 16 |
| 1.0 | 2.5 | 5 | 5.04 | −2.46 | 8 |
| 1.0 | 5.0 | 5 | 8.08 | −3.81 | 8 |
| 1.0 | 6.0 | 5 | 4.87 | 2.23 | 8 |

TABLE 4

Achievable Quadrature Error Corrections as a Function of
Sampling Rate (Signal-to-Noise = 20 dB, No. of Periods = 4)

| $f_C$(MHz) | $\frac{1}{T_S}$ (MHz) | $\epsilon^*_{IN}$ | $\epsilon^*_{OUT}$ | $\epsilon^*_{COR}$ | $T_C$(μsec) |
|---|---|---|---|---|---|
| 0.1 | 2.5 | 5 | 2.98 | 1.28 | 40 |
| 0.1 | 5.0 | 5 | 6.19 | −1.87 | 40 |
| 0.1 | 6.0 | 5 | 2.47 | 3.18 | 40 |
| 0.5 | 2.5 | 5 | 3.28 | 2.82 | 8 |
| 0.5 | 5.0 | 5 | 6.02 | −0.74 | 8 |
| 0.5 | 6.0 | 5 | 3.78 | 0.27 | 8 |
| 1.0 | 2.5 | 5 | 7.91 | −7.13 | 4 |
| 1.0 | 5.0 | 5 | 4.96 | 0.70 | 4 |
| 1.0 | 6.0 | 5 | 10.56 | −8.38 | 4 |

Tables 3 and 4, on the other hand, present the computation and correction results for an input S/N level of 20 dB. These results indicated that this level of S/N is inadequate for this procedure. As an example, in Table 4, for an input test signal of 0.5 MHz with a quadrature error of 5 degrees, the technique was only able to measure a 3.28-degree error and subsequently correct it to within 2.82 degrees. This result shows the need for a test signal with a sufficient S/N level (i.e. better than 30 dB).

Figure 2:
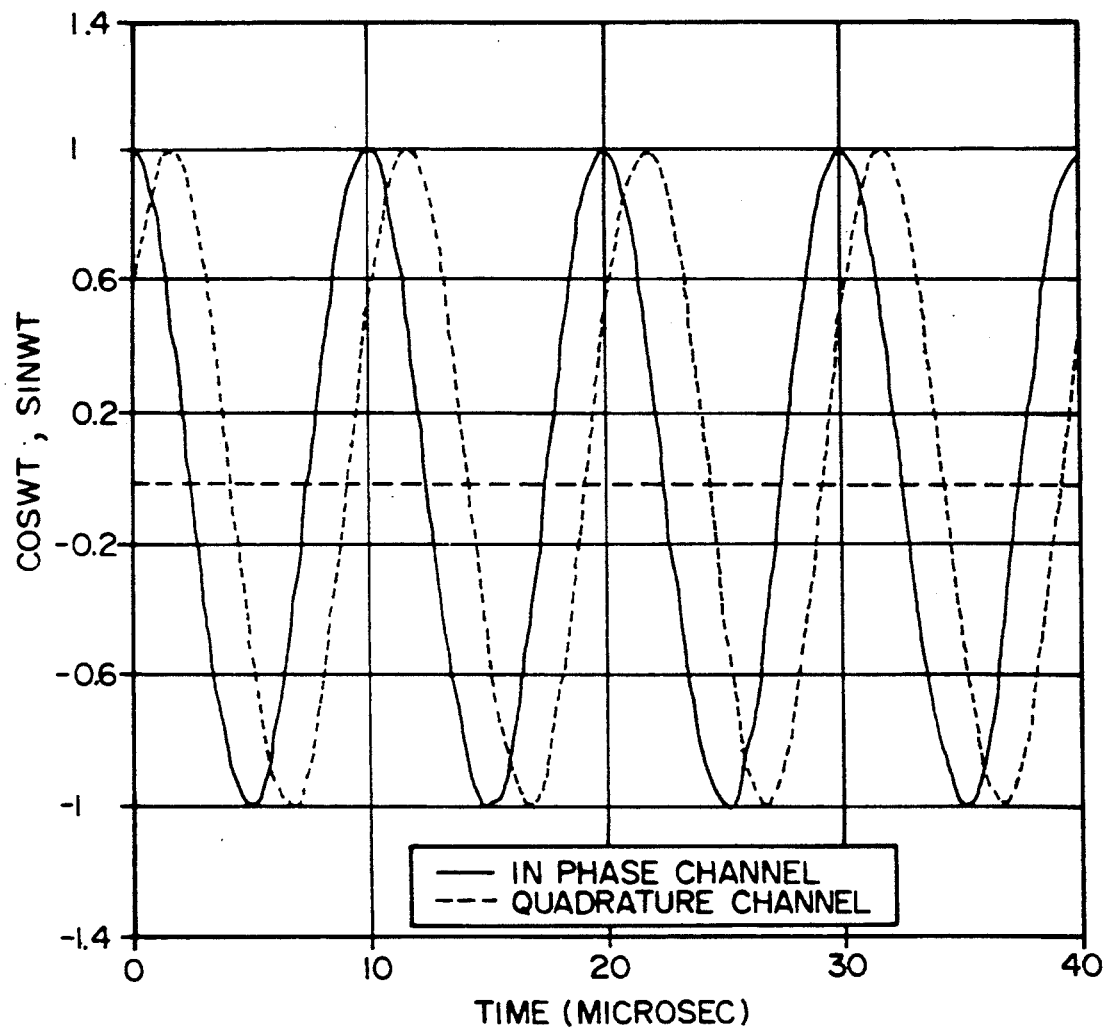
FIGS. 2 through 5 illustrate the effectiveness of the correction technique of the present invention with plots of I and Q channel signals versus time before and after correction, with FIG. 2 showing the signal plots with a 30-degree quadrature error prior to correction, FIG. 3 showing the I channel and the corrected Q channel signals 90 degrees out of phase with a test signal having a 40 dB S/N level, and FIGS. 4 and 5 showing the results of a lower S/N level (20 dB)

To further illustrate the effectiveness of this technique, plots of I and Q channels signals versus time before and after correction are shown in FIGS. 2 through 5. The expression for the I and Q signals are given by equations 1 and 2, whereas the expression for the signals after correction are given by equations 9 and 11. FIG. 2 shows the signal plots with a 30-degree quadrature error prior to correction. In this Figure, the I channel is represented by a solid line and the Q channel by a dashed line. Notice that when the Q channel is maximum, the I channel does not cross the zero point thus indicating that the two sinusoids are not 90 degrees out of phase.

Figure 3:
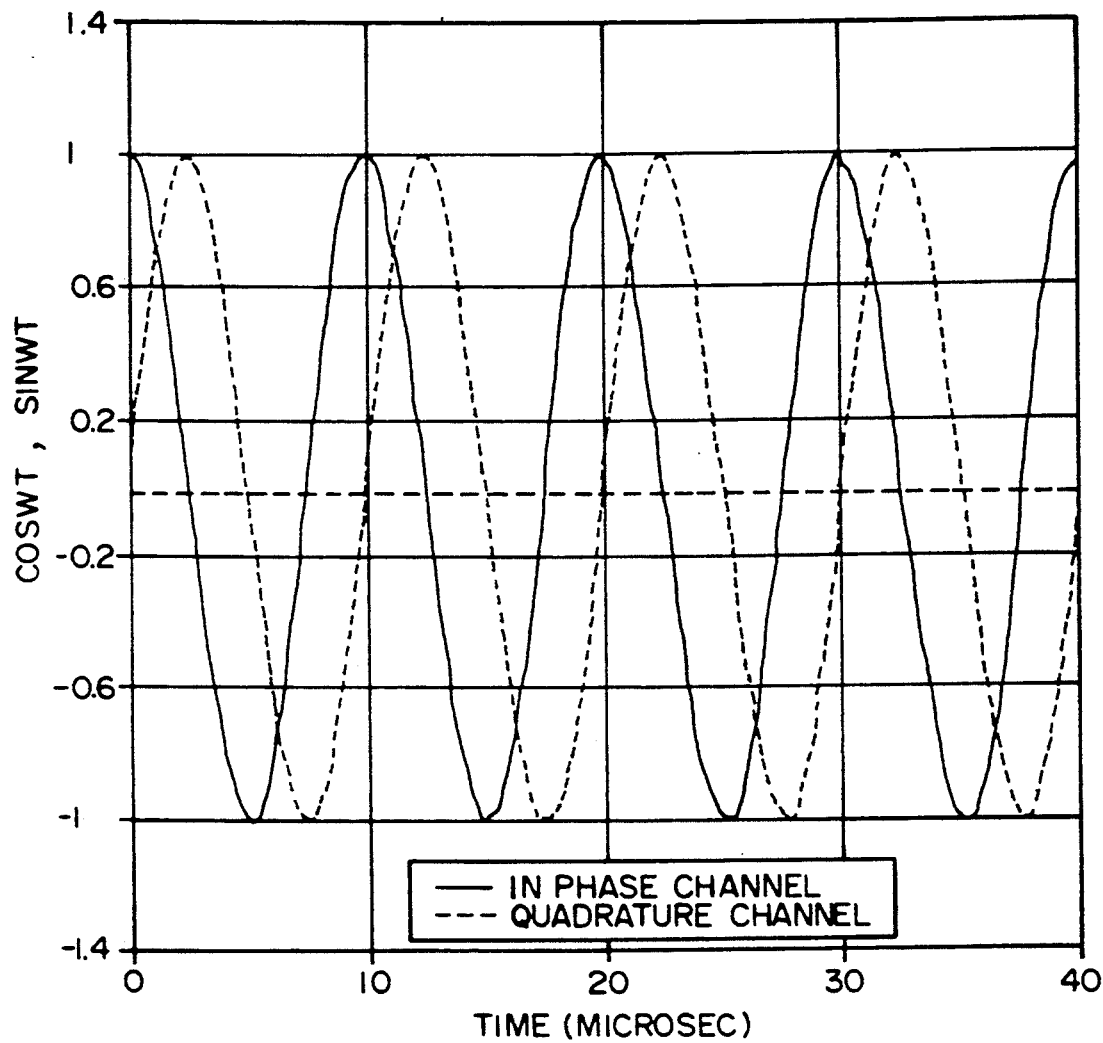
Figure 4:
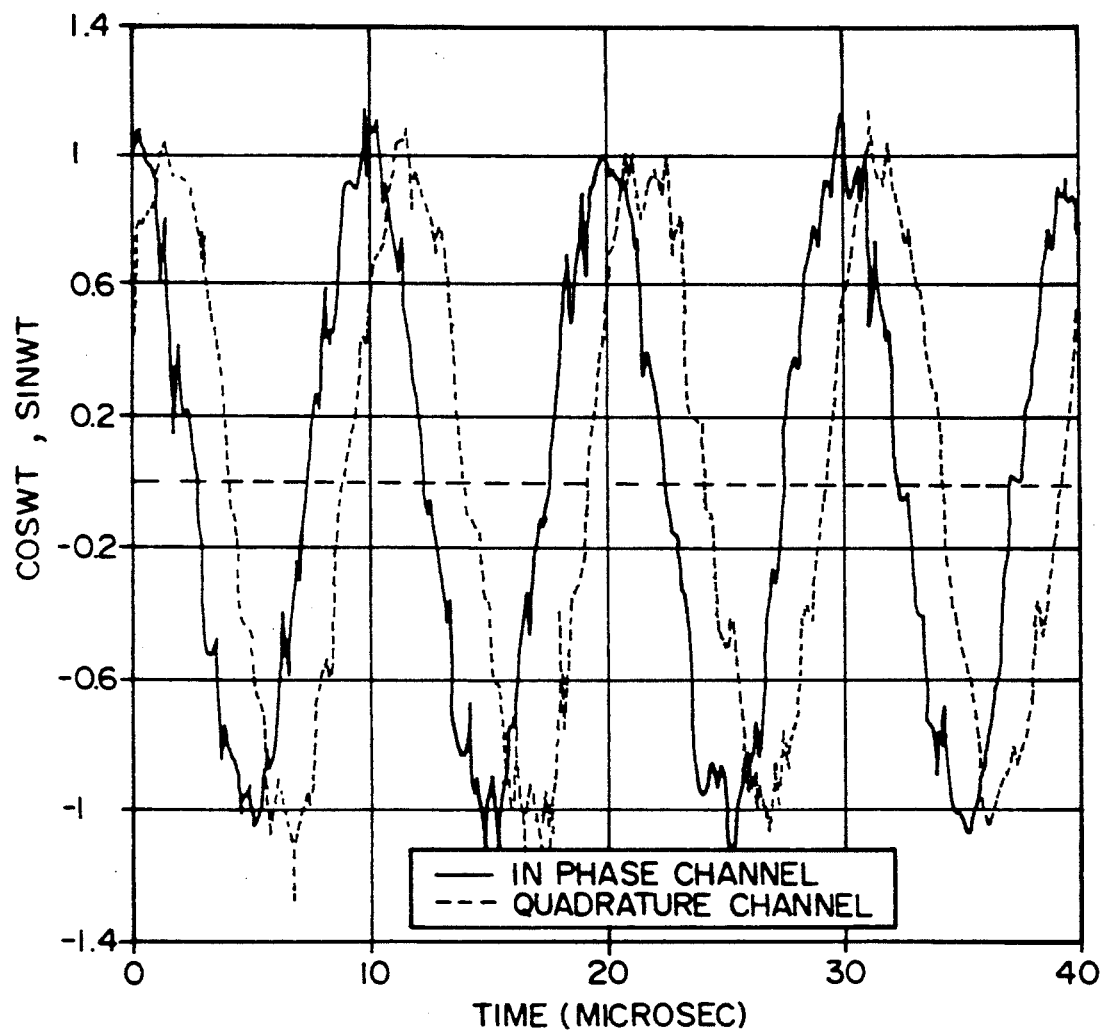
Figure 5:
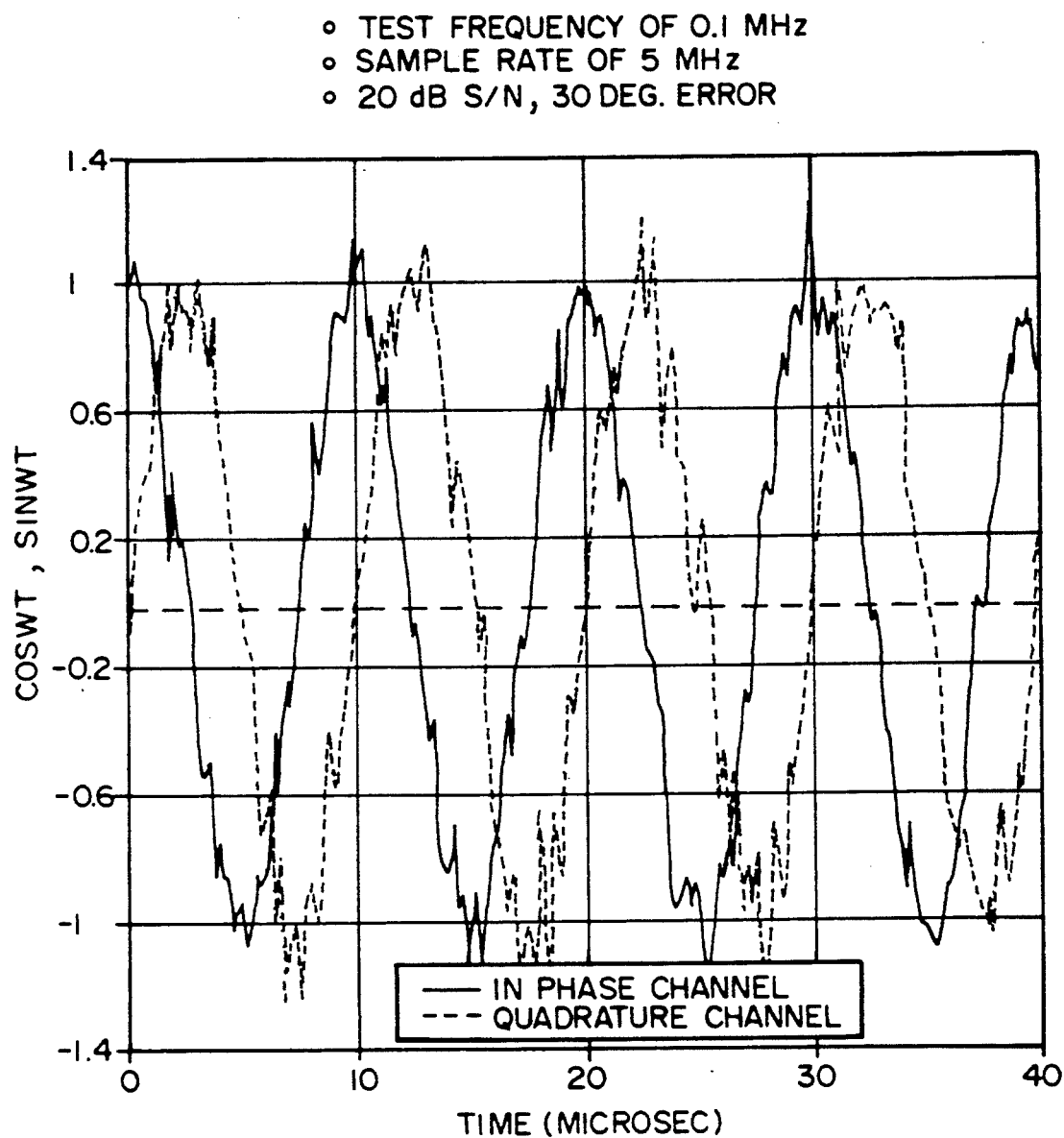
Figure 6:
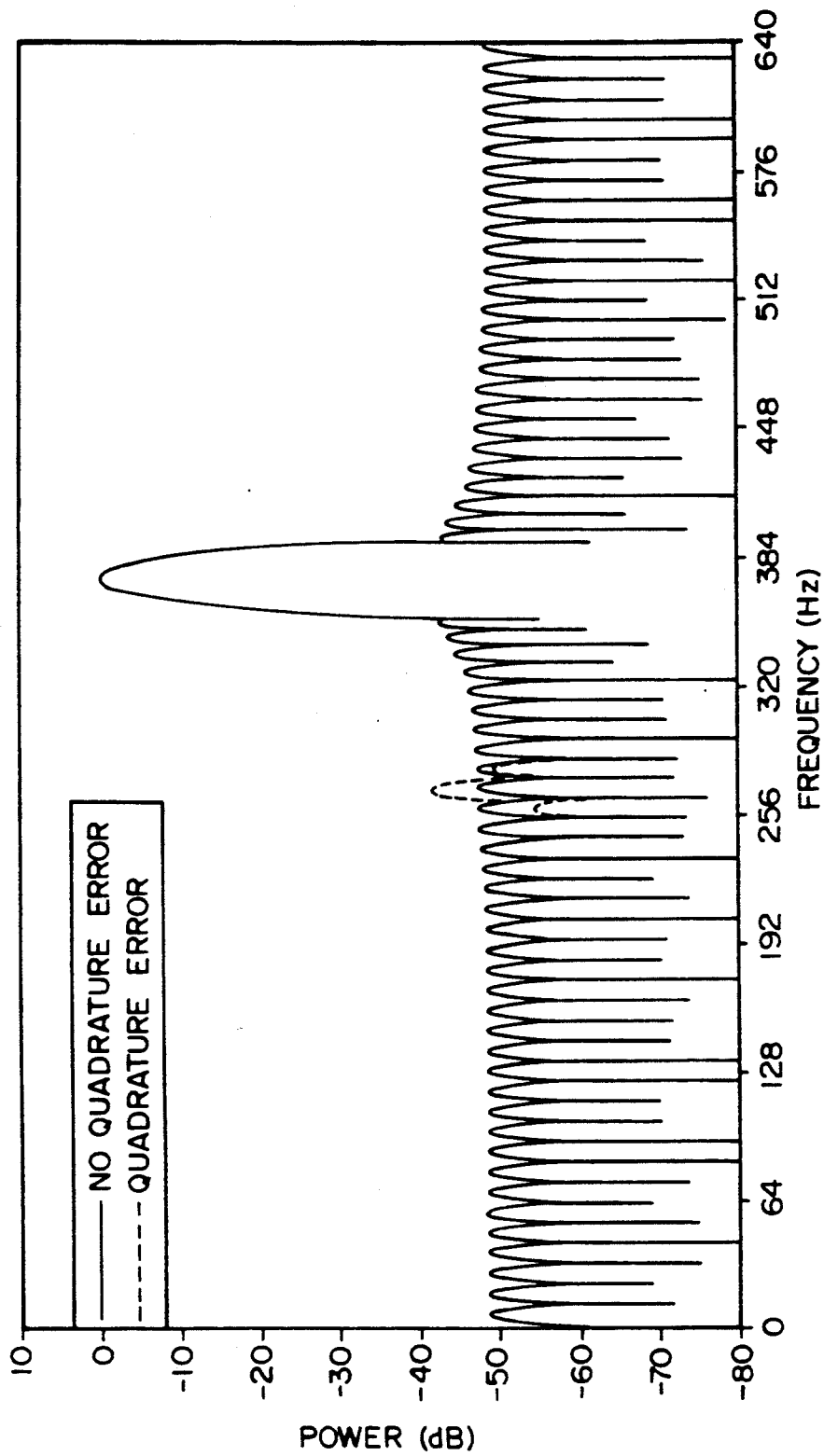
FIGS. 6, 7 and 8 illustrate the effect of a quadrature phase error in creating a frequency echo that appears as a false target at a doppler frequency, other than that of the target, which is a function of the magnitude of the quadrature phase error and the original doppler frequency of the received signal specifically for a target having a doppler frequency of 369 Hz for a system having 0.5-deg., 5-deg. and 50-deg. quadrature phase errors, respectively.
Figure 7:
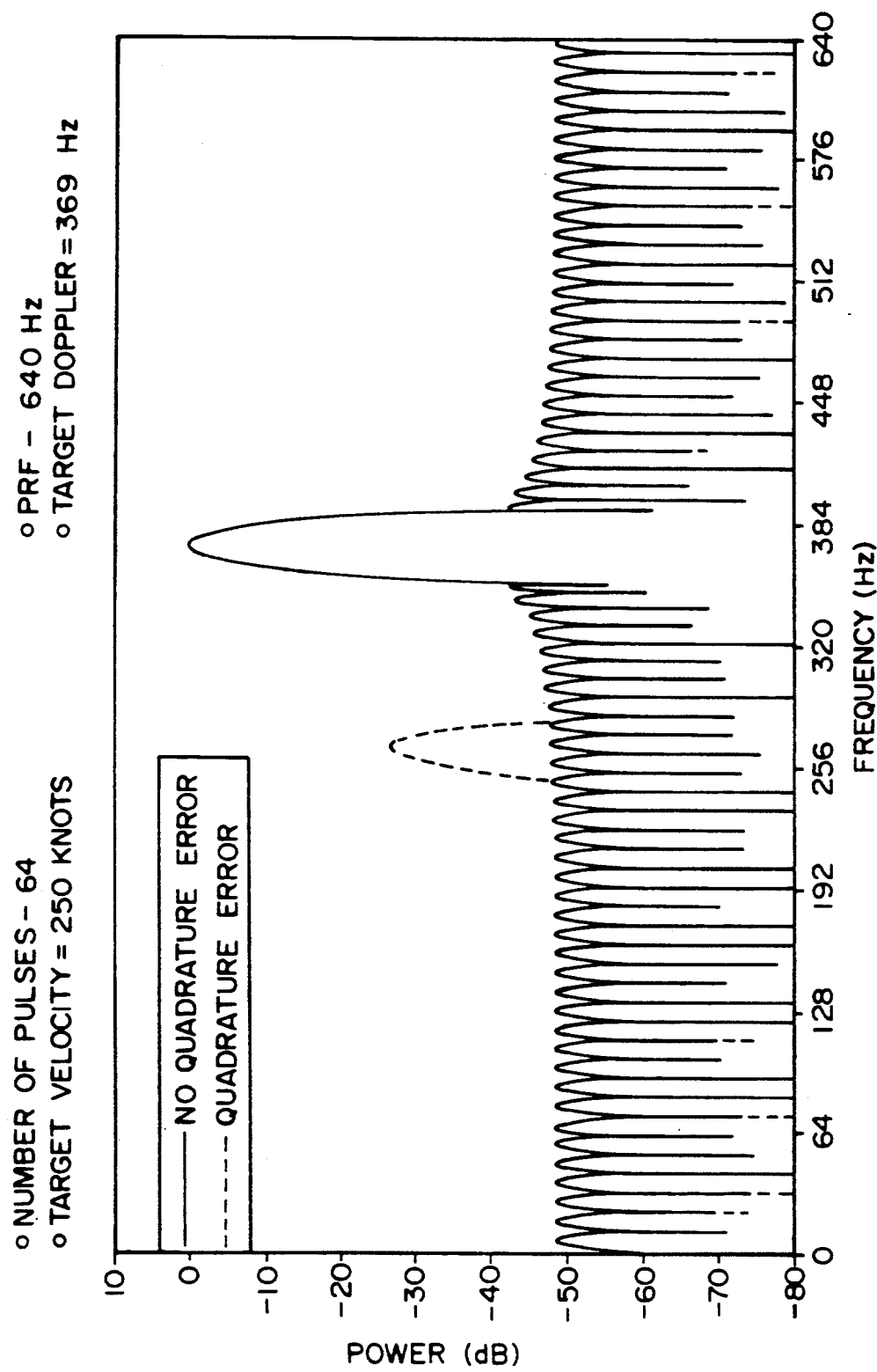
Figure 8:
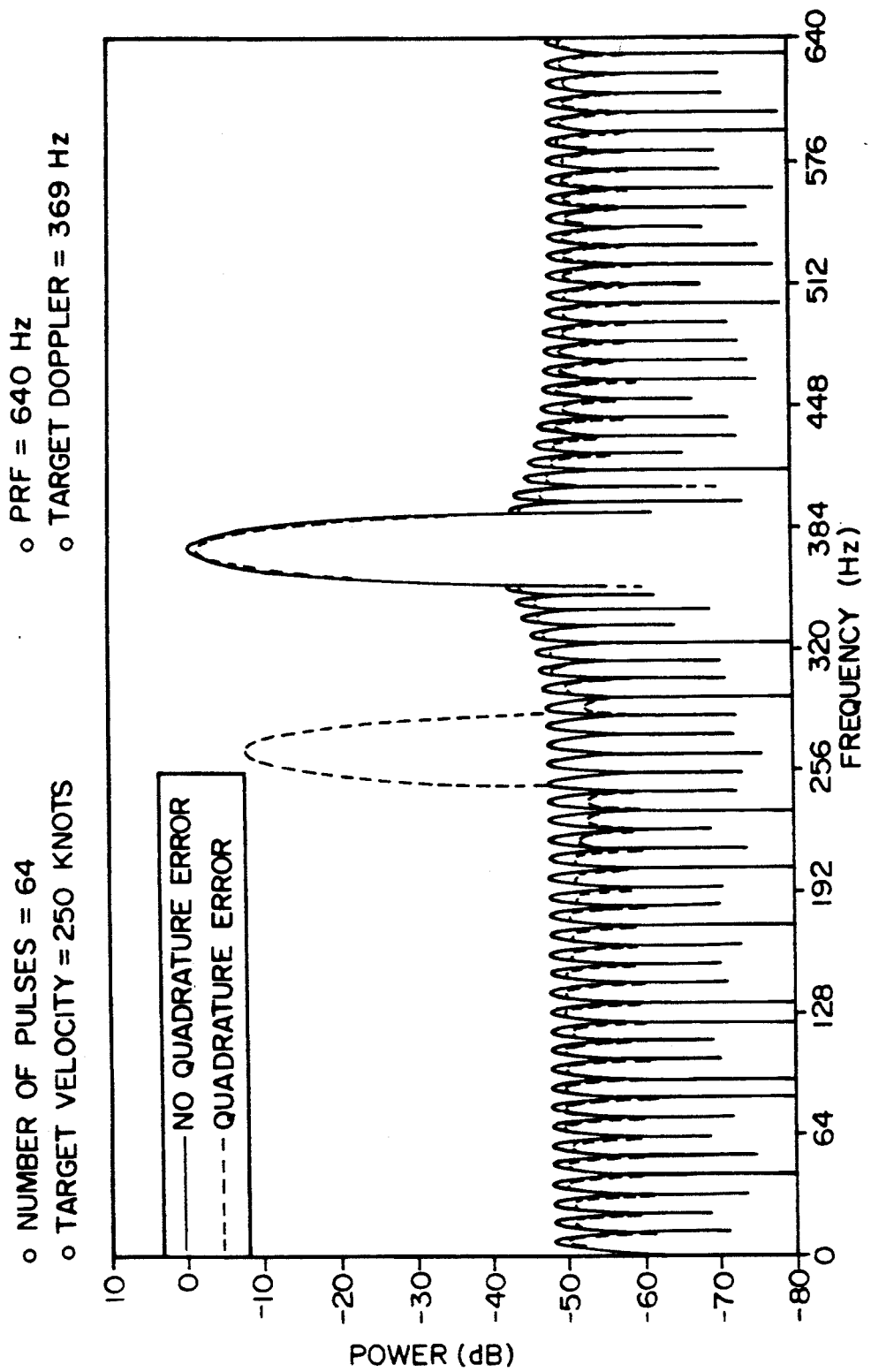

FIG. 3 shows that the I channel and the corrected Q channel signals are clearly 90 degrees out of phase, indicating that the digital correction technique successfully removed the 30-degree quadrature error introduced by the imperfect synchronous demodulator. The above examples were performed with a test signal having a 40 dB S/N level. The results of lower S/N level (20 dB) are shown in FIGS. 4 and 5.

While several embodiments and variations of the present invention for a system for correction of synchronous demodulator quadrature errors are described in detail herein, it would be apparent that the disclosure and teachings of the present invention will suggest many alternative designs to those skilled in the art.

What is claimed is:

1. A method for detecting quadrature phase errors introduced by a synchronous demodulator between the two quadrature channels (I and Q) of the synchronous demodulator and for correcting detected quadrature phase errors, without the need for high data sampling rates, comprising:

a. during normal operation of the synchronous demodulator, directly and simultaneously generating in-phase (I) and quadrature-phase (Q) channel signals;

b. testing the operation of the synchronous demodulator by introducing a periodic symmetrical test signal of known frequency into the synchronous demodulator;

c. during said introducing step, integrating the output of the synchronous demodulator over an integer multiple of periods to detect the quadrature phase error introduced by the synchronous demodulator, and generating a signal representative of the detected quadrature phase error and d. during normal operation of the synchronous demodulator, applying the in-phase (I) and quadrature-phase (Q) signals produced by the synchronous demodulator to a quadrature phase error correction network, along with the generated quadrature phase error signal, and said quadrature phase error correction network applying the quadrature phase error signal at least one of the in-phase and quadrature-phase signals to minimize or eliminate the detected quadrature phase error between the in-phase and quadrature-phase signals.

2. A method for detecting and correcting quadrature phase errors introduced by a synchronous demodulator as claimed in claim 1, wherein said step of integrating comprises applying the in-phase and quadrature-phase signals produced by the synchronous demodulator to an integrate and dump filter.

3. A method for detecting and correcting quadrature phase errors introduced by a synchronous demodulator as claimed in claim 2, wherein said integrate and dump filter is programmed to dump after a period of time $T = N2\pi/\omega_C$ sec, wherein N is an integer, and $\omega_C$ is the frequency of the test signal of known frequency.

4. A method for detecting and correcting quadrature phase errors introduced by a synchronous demodulator as claimed in claim 2, wherein the output signals of the synchronous demodulator in-phase (I) and quadrature-phase (Q) channels during said introducing step are given by:

$$I = A \cos(\omega_C t) + n_I(t) \qquad (1)$$

$$Q = A \cos(\omega_C t - \tfrac{\pi}{2}) + n_Q(t) \qquad (2)$$

wherein A is the amplitude of the signal and $N_I(t)$ and $N_Q(t)$ are respectively the noise components in each of the I and Q channels, $\omega_C$ is the frequency of the test signal of known frequency, and the output $E\{J\}$ of the integrate-and-dump filter is $$E\{J\} = \frac{A^2 \sin \epsilon}{2} + b$$

wherein $\epsilon$ is the quadrature phase error, b is a bias term representing the system noise contribution measured in the absence of an input signal, and $A^2$ is the average power.

5. A method for detecting and correcting quadrature phase errors introduced by a synchronous demodulator as claimed in claim 4, further including a summer circuit, coupled to the output of said integrate and dump filter, for substracting therefrom b the system noise contribution, a filter circuit is coupled to the output of said summer circuit for filtering from the output of said summer circuit the term $A^2$ wherein $A^2$ is the average power, such that the filter output isolates the sine of the detected synchronous demodulator error, $\epsilon_{OUT}$, and the output of said filter circuit is directed to an arc sine derivation means for taking the arc sine of the sine $\epsilon_{OUT}$, and the output of said arc sine derivation means $\epsilon_{OUT}$ is directed as an input to said quadrature phase error correction network.

6. A method for detecting and correcting quadrature phase errors introduced by synchronous demodulator as claimed in claim 5, wherein when the Q quadrature channel is being corrected, and $X_Q(nT_S)$ is the uncorrected Q channel output, and $X'_Q(nT_X)$ and $X'_I(nT_S)$ represent respectively the corrected Q and I channel outputs, then $X'_Q(nT_S)$ is derived by $$X_Q'(nT_s) = \frac{X_Q(nT_s) - X_I'(nT_s) \sin \epsilon_{OUT}}{\cos \epsilon_{OUT}} \qquad (11)$$

wherein
n—sample number $T_S$—sampling interval
$\omega_C - 2\pi f_C$
$f_C$—carrier frequency of the test signal of known frequency.

7. A method for detecting and correcting quadrature phase errors introduced by a synchronous demodulator as claimed in claim 5, where when the I quadrature channel is being corrected, and $X_I(nT_S)$ is the uncorrected I channel output and $X'_Q(nT_S)$ and $X'_I(nT_S)$ represent respectively the corrected Q and I channel outputs, the $X'_I(nT_S)$ is derived by $$X_I'(nT_s) = \frac{X_I(nT_s) + X_Q'(nT_s) \sin \epsilon_{OUT}}{\cos \epsilon_{OUT}} \qquad (12)$$

wherein
n—sample number
$T_S$—sampling interval
$\omega_C - 2\pi f_C$
$F_C$—carrier frequency of the test signal of known frequency.

* * * * *

UNITED STATES PATENT AND TRADEMARK OFFICE
CERTIFICATE OF CORRECTION

PATENT NO. : 5,315,620
DATED : May 24, 1994
INVENTOR(S) : Natalie Halawani, et al.

Page 1 of 5

It is certified that error appears in the above-indentified patent and that said Letters Patent is hereby corrected as shown below:

Column 3, line 15: "inphase" should read --in-phase--

Column 3, line 23: "n$\omega$(t)" should read --$N_Q(t)$--

Column 3, line 48: "X(nT$_s$) should read --$X_Q$ (nT$^s$)

Column 3, lines 54 & 67: "$X_Q$'" should read --$X'_Q$--

Column 3, lines 54 & 67: "$X_I$'" should read --$X'_I$--

Column 5, line 5: "2," should read --2.--

Column 5, line 13: "Acos" should read --A'cos--

Column 5, line 13: "($\omega_c t - \omega$)" should read --($\omega_c t - \theta$)--

Column 5, lines 48 & 49: "$\frac{1}{4}$" should read -- $\theta$ --

Column 6, line 4: after "A" insert --.--

Column 6, line 67: "of the" should read --of these--

Column 7, line 4: "(INI)" should read -- $IN_I$)--

UNITED STATES PATENT AND TRADEMARK OFFICE
CERTIFICATE OF CORRECTION

PATENT NO. : 5,315,620
DATED : May 24, 1994
INVENTOR(S) : Natalie Halawani, et al.

It is certified that error appears in the above-indentified patent and that said Letters Patent is hereby corrected as shown below:

Column 7, line 10: "$_O)$" should read --$_Q)$--

Column 7, line 11: "$\epsilon IN_{I,Q}$" should read --$\epsilon IN_{I,Q}$--

Column 7, lines 21 & 32: "$\epsilon t$" should read --$\omega t$--

Column 7, line 24: after "$\epsilon$" insert --)--

Column 7, line 40: after "$\omega$" insert --t--

Column 7, line 53: "$\epsilon IN)$" should read --$\epsilon_{IN})$--

Column 7, line 54: ")]" should read --)[ --

Column 7, line 62: "$X_Q$'" should read --$X'_Q$--

Column 7, line 62: "$X_I$'" should read --$X'_I$--

Column 8, line 2: "$\epsilon_{IN}$actual" should read --$\epsilon_{IN}$ = actual--

UNITED STATES PATENT AND TRADEMARK OFFICE
CERTIFICATE OF CORRECTION

PATENT NO. : 5,315,620
DATED : May 24, 1994
INVENTOR(S) : Natalie Halawani, et al.

It is certified that error appears in the above-indentified patent and that said Letters Patent is hereby corrected as shown below:

Column 8, line 18: "$\epsilon t$" should read -- $\omega t$ --

Column 8, line 23: "$X_I$'" should read -- $X'_I$ --

Column 8, line 23: "$X_Q$'" should read -- $X'_Q$ --

Column 8, line 37: "(SN)" should read --(S/N)--

Column 8, line 40: "Table" should read --Tables--

Column 8, line 43: "5degree" should read --5 degree--

Column 9, lines 64 & 65: "expression" should read --expressions--

Column 10, line 18: "would" should read --should--

UNITED STATES PATENT AND TRADEMARK OFFICE
CERTIFICATE OF CORRECTION

PATENT NO. : 5,315,620
DATED : May 24, 1994
INVENTOR(S) : Natalie Halawani, et al.

It is certified that error appears in the above-indentified patent and that said Letters Patent is hereby corrected as shown below:

Column 10, line 41, Claim 1: "error and" should read --error; and--

Column 10, line 49, Claim 1: after "signal" insert --to--

Column 11, line 6, Claim 4: "$\frac{1}{4}$" should read --$\frac{1}{Q}$--

Column 12, line 5, Claim 6: "$(nT_x)$" should read --$(nT_s)$--

Column 12, line 10, Claim 6: "$X_Q'$" should read --$X'_Q$--

UNITED STATES PATENT AND TRADEMARK OFFICE
CERTIFICATE OF CORRECTION

PATENT NO. : 5,315,620
DATED : May 24, 1994
INVENTOR(S) : Natalie Halawani, et al.

It is certified that error appears in the above-indentified patent and that said Letters Patent is hereby corrected as shown below:

Column 12, line 10, Claim 6: "$X_I$'" should read --$X'_I$--

Column 12, line 19, Claim 7: "where" should read --wherein--

Column 12, line 26, Claim 7: "$X_I$'" should read --$X'_I$--

Column 12, line 26, Claim 7: "$X_Q$'" should read --$X'_Q$--

Column 12, line 32, Claim 7: "$F_c$" should read --Fc--

Signed and Sealed this

Twelfth Day of September, 1995

BRUCE LEHMAN

Attest:

*Attesting Officer*  *Commissioner of Patents and Trademarks*